US006225846B1

United States Patent
Wada et al.

(10) Patent No.: US 6,225,846 B1
(45) Date of Patent: *May 1, 2001

(54) BODY VOLTAGE CONTROLLED SEMICONDUCTOR INTEGRATED CIRCUIT

(75) Inventors: Yoshiki Wada; Kimio Ueda, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/867,854

(22) Filed: Jun. 3, 1997

(30) Foreign Application Priority Data

Jan. 23, 1997 (JP) ...................................... 9-010511

(51) Int. Cl.[7] ...................................... H03K 3/286
(52) U.S. Cl. ........................ 327/215; 327/219; 327/534
(58) Field of Search .................................. 327/215, 219, 327/534

(56) References Cited

U.S. PATENT DOCUMENTS

| 3,702,990 | * | 11/1972 | Ross .................................... 327/534 |
| 4,847,522 | * | 7/1989 | Fuller et al. ........................ 326/58 |
| 5,498,882 | | 3/1996 | Houston .............................. 257/57 |
| 5,552,723 | | 9/1996 | Shigehara et al. ................. 327/534 |
| 5,748,016 | * | 5/1998 | Kurosawa ........................... 327/108 |
| 5,767,733 | * | 6/1998 | Grugett .............................. 327/534 |

FOREIGN PATENT DOCUMENTS

| 0 614 279 A2 | * | 1/1994 | (EP) . |
| 7-86917 | | 3/1995 | (JP) . |

OTHER PUBLICATIONS

T. Fuse et al., "0.5V SOI CMOS Pass–Gate Logic," 1996 IEEE International Solid–State Circuits Conference, Digest of Technical Papers, TP5.6: pp. 88–89.

T. Douseki et al., "A 0.5V SIMOX–MTCMOS Circuit With 200ps Logic Gate," 1996 IEEE International Solid–State Circuits Conference, Digest of Technical Papers, TP5.4: pp. 84–85.

* cited by examiner

Primary Examiner—Terry D. Cunningham
(74) Attorney, Agent, or Firm—Burns, Doane, Swecker & Mathis, LLP

(57) ABSTRACT

A body voltage controlled semiconductor integrated circuit which can solve a problem of a conventional CMOS inverter in that it cannot operate at a supply voltage beyond the built-in voltage of the CMOS transistors if their body electrodes are each connected to their own gate electrodes rather than to their source electrodes to quicken the operation of the CMOS inverter. A voltage divider circuit is provided which conducts during the operation of the CMOS transistors of the inverter so that the body voltages of the PMOS transistor or the NMOS transistor of the inverter is varied in the direction of reducing their threshold voltages. By controlling the size of electrodes and the voltages applied to the body electrodes of transistors constituting the voltage divider circuit, it becomes possible to operate the CMOS inverter at the supply voltage beyond the built-in voltage.

24 Claims, 6 Drawing Sheets

BODY VOLTAGE CONTROLLED SEMICONDUCTOR INTEGRATED CIRCUIT

BACKGROUND OF THE INVENTION

1. Field of the Invention

The present invention relates to a semiconductor integrated circuit using MOS transistors, and particularly to a body voltage controlled semiconductor integrated circuit operating with body voltages of the MOS transistors being controlled.

2. Description of Related Art

FIG. 5 is a circuit diagram showing a conventional body voltage controlled semiconductor integrated circuit. In this figure, the reference numeral 11 designates a first inverter, and 12 designates a second inverter. The first inverter 11 includes a PMOS transistor P11 and an NMOS transistor N11, in which their gates are interconnected, their drains are also interconnected, the body electrode and source electrode of the PMOS transistor P11 are connected to a power supply E11, and the body electrode and source electrode of the NMOS transistor N11 are connected to earth E.

The second inverter 12 includes a PMOS transistor P12 and an NMOS transistor N12, in which their gates are interconnected, their drains are also interconnected, their gates are connected to the output terminal of the first inverter 11 as well as to the body electrodes of the PMOS transistor P12 and NMOS transistor N12, the source electrode of the PMOS transistor P12 is connected to a power supply E12, and the source electrode of the NMOS transistor N12 is connected to the earth E. In addition, a link L12 interconnecting the drains of the two transistors of the first inverter 11 is connected to a link L13 interconnecting the gates of the two transistors of the second inverter 12.

The reference symbol "in" designates an input terminal connected to a link L11 interconnecting the gates of the PMOS transistor P11 and NMOS transistor N11, "out" designates an output terminal connected to a link L14 interconnecting the drains of the PMOS transistor P12 and NMOS transistor N12 constituting the second inverter 12, and c designates a load capacitance. Besides, the reference character G designates a gate electrode, B designates a body electrode, D designates a drain electrode and S designates a source electrode.

Next, the operation will be described. When the input terminal "in" is placed at H (high), the NMOS transistor N11 is turned on and the output of the first inverter 11 falls to L (low). Thus, the PMOS transistor P12 in the second inverter 12 is turned on, and the electric charge in the load capacitance c is absorbed to the power supply so that the output terminal "out" becomes H.

In this circuit, the PMOS transistor P11 has a characteristic as shown in FIG. 6: Its threshold voltage decreases with a decrease in the body voltage applied to its body. In contrast with this, the NMOS transistor N11 has a characteristic as shown in FIG. 7: Its threshold voltage decreases with an increase in the body voltage applied to its body. As their threshold voltage decreases, their operation is quickened. Incidentally, a related art to the conventional circuit is disclosed in Japanese patent application laid-open No. 7-86917, or U.S. Pat. No. 5,552,723.

The conventional body voltage controlled semiconductor integrated circuit with such a structure has the following problem. If a voltage above 0.8 V (built-in voltage) is applied to the second inverter 12 including the PMOS transistor P12 and NMOS transistor N12 with their gate electrodes connected to their body electrodes, a parasitic bipolar transistor composed of semiconductor layers forming the drain, body and source is turned on, and thus the transistors must operate in their saturation domain, which will retard their operation. This presents a problem in that the power supply voltage must be limited to below 0.8 V when the gate electrodes are connected to the body electrodes as in the second inverter 12. Furthermore, there is another problem that such a circuit is weak to external noise.

SUMMARY OF THE INVENTION

The present invention is implemented to solve the foregoing problems. It is therefore an object of the present invention to provide a body voltage controlled semiconductor integrated circuit usable at the supply voltage above the built-in voltage.

According to a first aspect of the present invention, there is provided a body voltage controlled semiconductor integrated circuit comprising: a first inverter including a first PMOS transistor, a first NMOS transistor, a first link interconnecting a gate electrode of the first PMOS transistor and a gate electrode of the first NMOS transistor, a second link interconnecting a drain electrode of the first PMOS transistor and a drain electrode of the first NMOS transistor; a second inverter including a second PMOS transistor, a second NMOS transistor, a third link interconnecting a gate electrode of the second PMOS transistor and a gate electrode of the second NMOS transistor, a fourth link interconnecting a drain electrode of the second PMOS transistor and a drain electrode of the second NMOS transistor; a voltage divider circuit including a third PMOS transistor, a third NMOS transistor, a fifth link interconnecting a drain electrode of the third PMOS transistor and a drain electrode of the third NMOS transistor, a sixth link interconnecting a gate electrode of the third PMOS transistor and a gate electrode of the third NMOS transistor, a fourth PMOS transistor which is connected between a body electrode and a source electrode of the third PMOS transistor, and which is always kept ON, a fourth NMOS transistor which is connected between a body electrode and a source electrode of the third NMOS transistor, and which is always kept ON, wherein the fifth link is connected with the second link and the third link, the source electrode of the third PMOS transistor is connected to a body electrode of the second PMOS transistor, and the source electrode of the third NMOS transistor is connected to a body electrode of the second NMOS transistor.

According to a second aspect of the present invention, there is provided a body voltage controlled semiconductor integrated circuit comprising: a first inverter including a first PMOS transistor, a first NMOS transistor, a first link interconnecting a gate electrode of the first PMOS transistor and a gate electrode of the first NMOS transistor, a second link interconnecting a drain electrode of the first PMOS transistor and a drain electrode of the first NMOS transistor; a second inverter including a second PMOS transistor, a second NMOS transistor, a third link interconnecting a gate electrode of the second PMOS transistor and a gate electrode of the second NMOS transistor, a fourth link interconnecting a drain electrode of the second PMOS transistor and a drain electrode of the second NMOS transistor; a voltage divider circuit including a third PMOS transistor with its body electrode and source electrode interconnected, a third NMOS transistor with its body electrode and source electrode interconnected, a fifth link interconnecting a drain electrode of the third PMOS transistor and a drain electrode of the third NMOS transistor, a sixth link interconnecting a gate electrode of the third PMOS transistor and a gate electrode of the third NMOS transistor, a fourth PMOS transistor which is connected to the body electrode of the third PMOS transistor, and which is always kept ON, a fourth NMOS transistor which is connected to the body electrode of the third NMOS transistor, and which is always kept ON, wherein the fifth link is connected with the second link and the third link, the source electrode of the third PMOS transistor is connected to a body electrode of the second PMOS transistor, and the source electrode of the third NMOS transistor is connected to a body electrode of the second NMOS transistor.

Here, the sixth link may be connected to the fourth link.

The body voltage controlled semiconductor integrated circuit may further comprise a third inverter with its input terminal connected to the second link and its output terminal connected to the sixth link.

DETAILED DESCRIPTION OF THE PREFERRED EMBODIMENTS

The invention will now be described with reference to the accompanying drawings.

Embodiment 1

Figure 1:
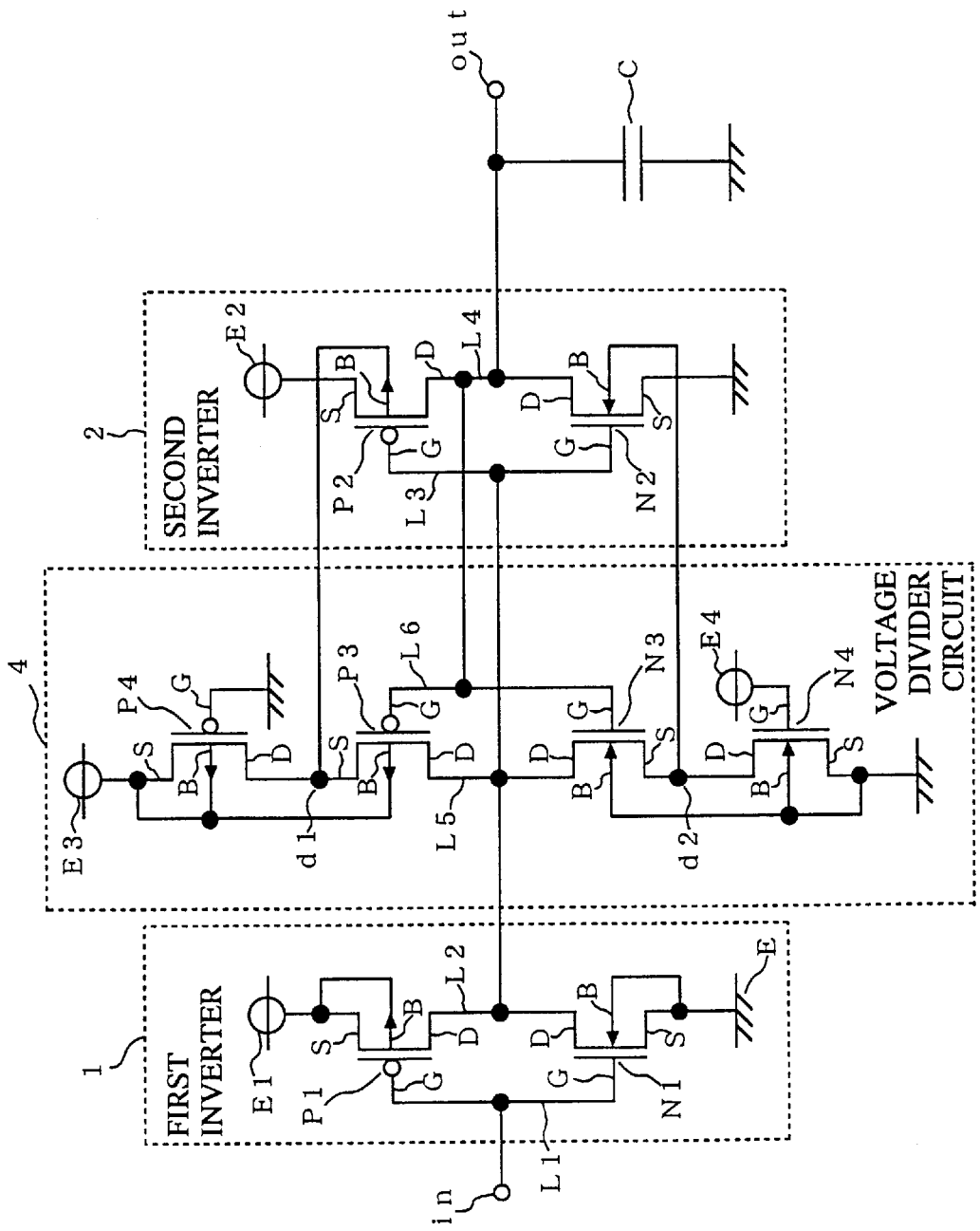
FIG. 1 is a circuit diagram showing an inverter as an embodiment 1 of the body voltage controlled semiconductor integrated circuit in accordance with the present invention.

FIG. 1 is a circuit diagram showing an embodiment 1 in accordance with the present invention. In this figure, the reference numeral 1 designates a first inverter, 2 designates a second inverter, and 4 designates a voltage divider circuit. The first inverter 1 includes a PMOS transistor P1 and an NMOS transistor N1, in which their gates are interconnected, their drains are also interconnected, the body electrode and source electrode of the PMOS transistor P1 are connected to a power supply E1, and the body electrode and source electrode of the NMOS transistor N1 are connected to the earth E.

The second inverter 2 includes a PMOS transistor P2 and an NMOS transistor N2, in which their gates are interconnected, their drains are also interconnected, the source electrode of the PMOS transistor P2 is connected to a power supply E2, and the source electrode of the NMOS transistor N2 is connected to the earth E.

The reference symbol "in" designates an input terminal connected to a link L1 interconnecting the gates of the PMOS transistor P1 and NMOS transistor N1, "out" designates an output terminal connected to a link L4 interconnecting the drains of the PMOS transistor P2 and NMOS transistor N2 constituting the second inverter 2, and c designates a load capacitance.

The voltage divider circuit 4 includes a PMOS transistor P3 and an NMOS transistor N3, in which their gates are interconnected, and their drains are also interconnected. The PMOS transistor P3 has its body electrode connected to the body electrode and source electrode of a PMOS transistor P4, and has its source electrode connected to the drain electrode of the PMOS transistor P4. The PMOS transistor P4 has its source electrode connected to a power supply terminal E3, and its gate electrode connected to the earth E, thereby always keeping the ON state.

On the other hand, the NMOS transistor N3 has its body electrode connected to the body electrode and source electrode of an NMOS transistor N4, and has its source electrode connected to the drain electrode of the NMOS transistor N4. The NMOS transistor N4 has its source electrode connected to the earth E, and its gate electrode connected to a power supply E4, thereby always keeping the ON state.

A link L5 interconnecting the drains of the PMOS transistor P3 and NMOS transistor N3 is connected to a link L2 interconnecting the drain electrodes of the PMOS transistor P1 and NMOS transistor N1 constituting the first inverter 1, as well as to a link L3 interconnecting the gate electrodes of the PMOS transistor P2 and NMOS transistor N2 constituting the second inverter 2. In addition, a link L6 interconnecting the gate electrodes of the PMOS transistor P3 and NMOS transistor N3 is connected to link L4 interconnecting the drain electrodes of the PMOS transistor P2 and NMOS transistor N2 constituting the second inverter 2, and the source electrodes of the PMOS transistor P3 and NMOS transistor N3 are connected to the body electrodes of the PMOS transistor P2 and NMOS transistor N2, respectively. The reference character c designates a load capacitance connected across the output terminal "out" and the earth E. Besides, the reference character G designates a gate electrode, B designates a body electrode, D designates a drain electrode and S designates a source electrode.

Next, the operation will be described.

First, let us consider the operation when an input signal applied to the input terminal "in" changes from L to H. If the input signal applied to the input terminal is L, the output of the first inverter 1 is H. The output of the second inverter 2 is L, and the PMOS transistor P3 and NMOS transistor N3 in the voltage divider circuit 4 are ON and OFF, respectively, because the gate electrodes of the PMOS transistor P3 and NMOS transistor N3 are connected to the output of the second inverter 2. The PMOS transistor P4 and NMOS transistor N4 are always kept ON.

Next, if the input signal to the input terminal "in" changes to H, the PMOS transistor P1 is turned off and the NMOS transistor N1 is turned on in the first inverter 1. In this case, a state occurs in which the three transistors PMOS transistors P3 and P4 and the NMOS transistor N1 are simultaneously ON, in which case the voltage at a point dl falls below the supply voltage applied to the power supply terminal E3 owing to a voltage drop due to the current flowing through the three transistors.

Since the point dl is connected to the body electrode of the PMOS transistor P2, the body voltage also falls below the supply voltage. This reduces the threshold voltage of the PMOS transistor P2 and increases the current flowing therethrough, which in turn quickens its inversion operation. Thus, the PMOS transistor P2 is turned on and the NMOS transistor N2 is turned off, and the second inverter 2 is inverted, thereby changing the voltage at the output terminal "out" from L to H. Once the voltage at the output terminal "out" has been changed to H, the PMOS transistor P3, receiving that voltage H at its gate, is turned off, and the body voltage of the PMOS transistor P2 is returned to the supply voltage. This will increase the threshold voltage of the PMOS transistor P2 again, and limits its leakage current to a small value.

In contrast with the foregoing, when the input signal to the input terminal "in" is changed from H to L, a state occurs in which the three transistors PMOS transistor P1, NMOS transistors N3 and N4 are simultaneously ON, and hence the voltage at a point d2 rises owing to the current flowing through the three transistors.

Since the point d2 is connected to the body electrode of the NMOS transistor N2, the body voltage also rises. This reduces the threshold voltage of the NMOS transistor N2 and increases the current flowing therethrough, which quickens its inversion operation.

As described above, according to the embodiment 1, the speed of the inversion operation of the inverter is improved as compared with the conventional inverter. In addition, it becomes possible for the body voltage controlled semiconductor integrated circuit to operate beyond the built-in voltage by controlling the range of variation in the body voltages of the voltage divider circuit 4 by adjusting the width and length of the gates of the PMOS transistors P3 and P4, and NMOS transistors N3 and N4 constituting the voltage divider circuit 4.

Embodiment 2

Figure 2:
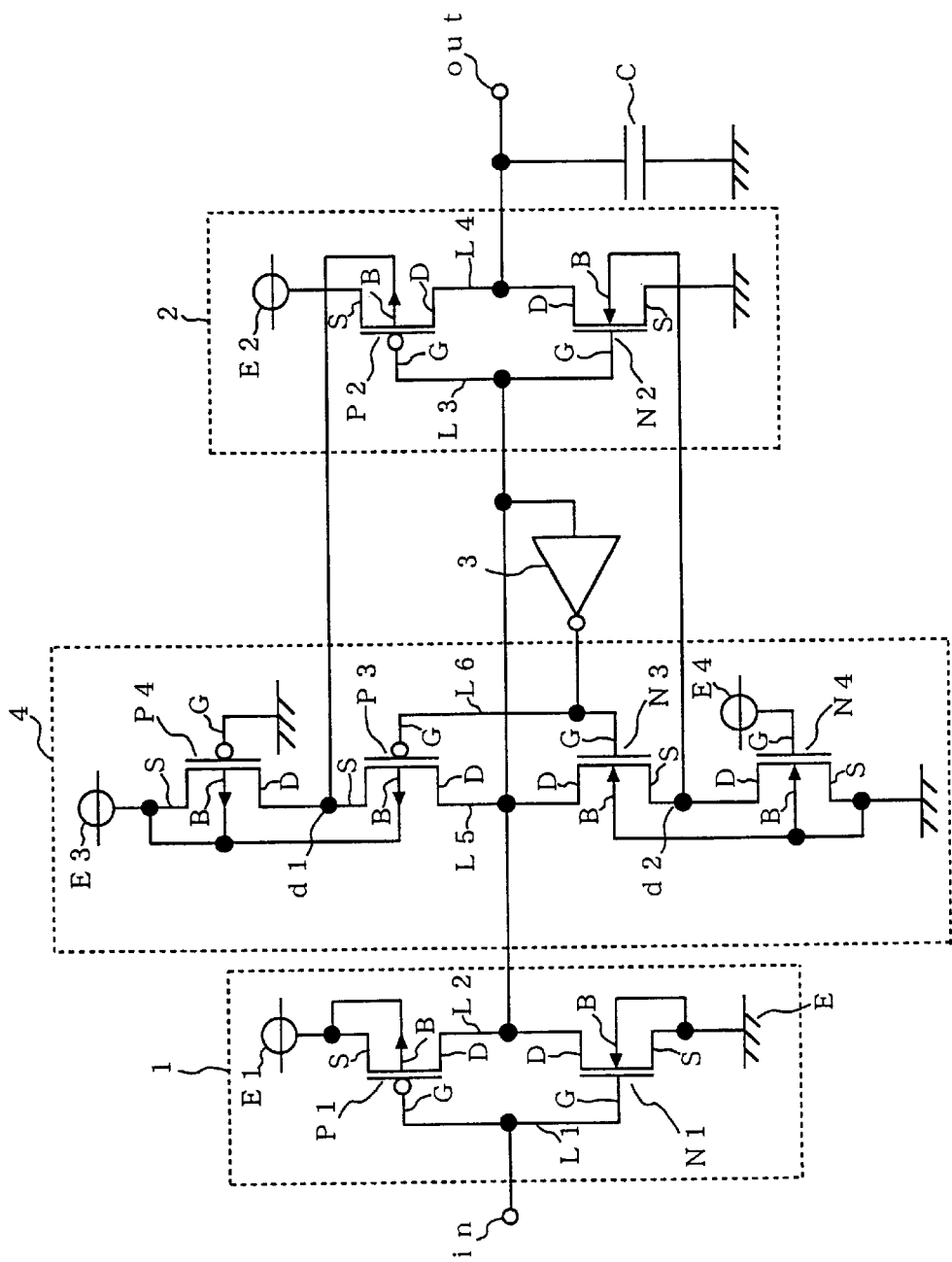
FIG. 2 is a circuit diagram showing an inverter as an embodiment 2 of the body voltage controlled semiconductor integrated circuit in accordance with the present invention.

FIG. 2 is a circuit diagram showing an embodiment 2 of the body voltage controlled semiconductor integrated circuit in accordance with the present invention. In this figure, the reference numeral 3 designates a third inverter. The third inverter 3 has its input terminal connected to the link L5 interconnecting the drain electrodes of the PMOS transistor P3 and NMOS transistor N3, and has its output terminal connected to the link 6 interconnecting the gates of the PMOS transistor P3 and NMOS transistor N3. Since the remaining structure is the same as that shown in FIG. 1, the same portions are designated by the same reference symbols, thus to omit duplicate explanation.

In the embodiment 1 as shown in FIG. 1, the output of the second inverter 2 is fed back to the link L6 as described above. In contrast, in the present embodiment 2, the output of the third inverter 3 which is connected in parallel with the second inverter 2 is fed back to the link L6 to achieve the operation similar to that of the embodiment 1.

This provides the embodiment 2 with an advantage over the embodiment 1 in isolating the load capacitance from the feedback loop from the output of the second inverter 2 to the link L6.

Embodiment 3

Figure 3:
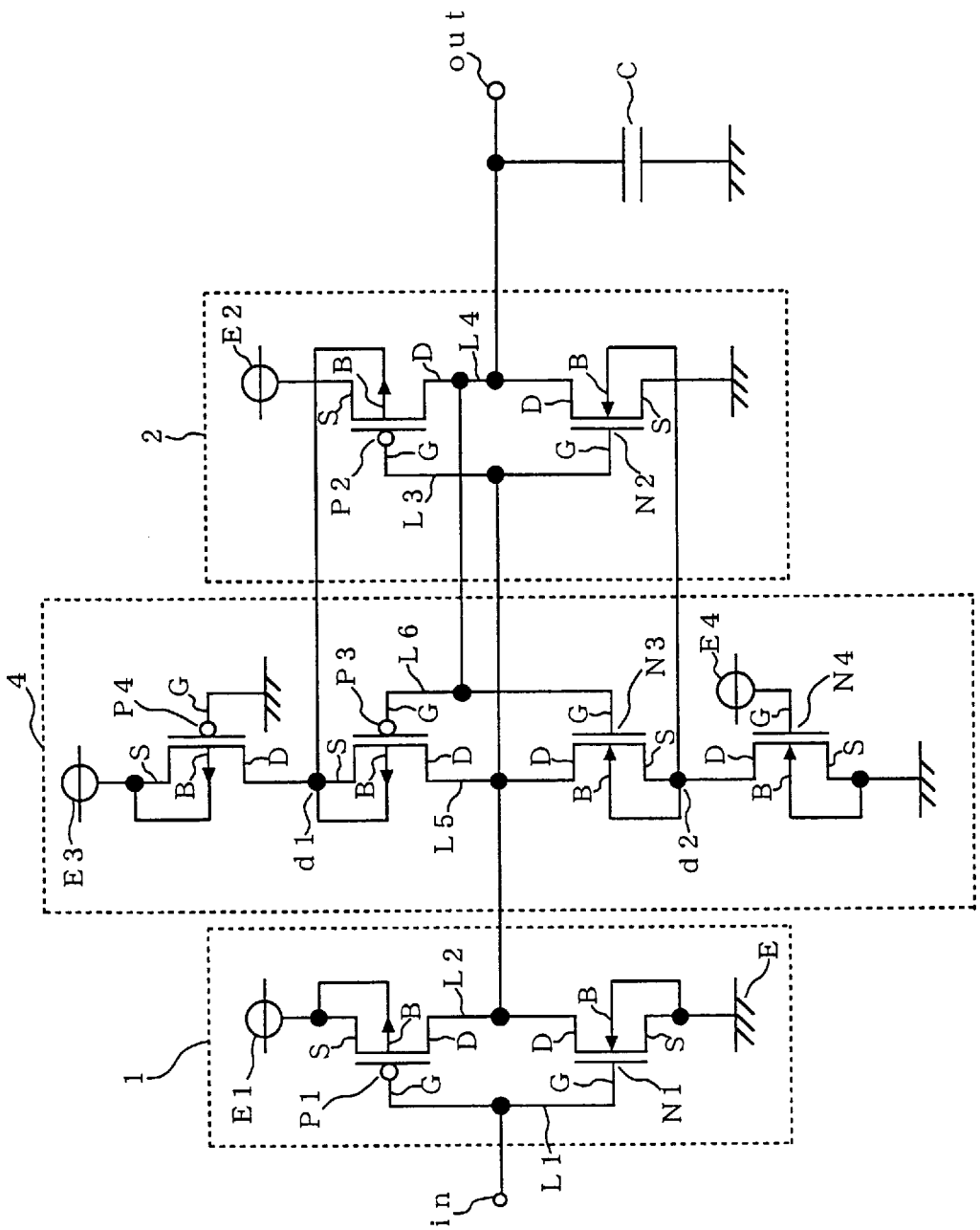
FIG. 3 is a circuit diagram showing an inverter as an embodiment 3 of the body voltage controlled semiconductor integrated circuit in accordance with the present invention.

FIG. 3 is a circuit diagram showing an embodiment 3 of the body voltage controlled semiconductor integrated circuit in accordance with the present invention. In this embodiment, the PMOS transistor P3 constituting the voltage divider circuit 4 has its body electrode and source electrode interconnected, and the interconnected end is further connected to the PMOS transistor P4 which is always kept ON. Likewise, the NMOS transistor N3 has its body electrode and source electrode interconnected, and the interconnected end is further connected to the NMOS transistor N4 which is always kept ON. Since the remaining structure is the same as that of the embodiment 1 as shown in FIG. 1, the same portions are designated by the same reference symbols, thus to omit duplicate explanation.

With such an arrangement, the body voltage of the PMOS transistor P3 becomes equal to its source voltage, and the body voltage of the NMOS transistor N3 becomes equal to its source voltage. This will result in the bias effect of the substrate, which prevents the threshold voltage of these transistors from being increased. As a result, the switching speed of the transistors is increased, and hence the inversion operation of the second inverter 2 is quickened.

Embodiment 4

Figure 4:
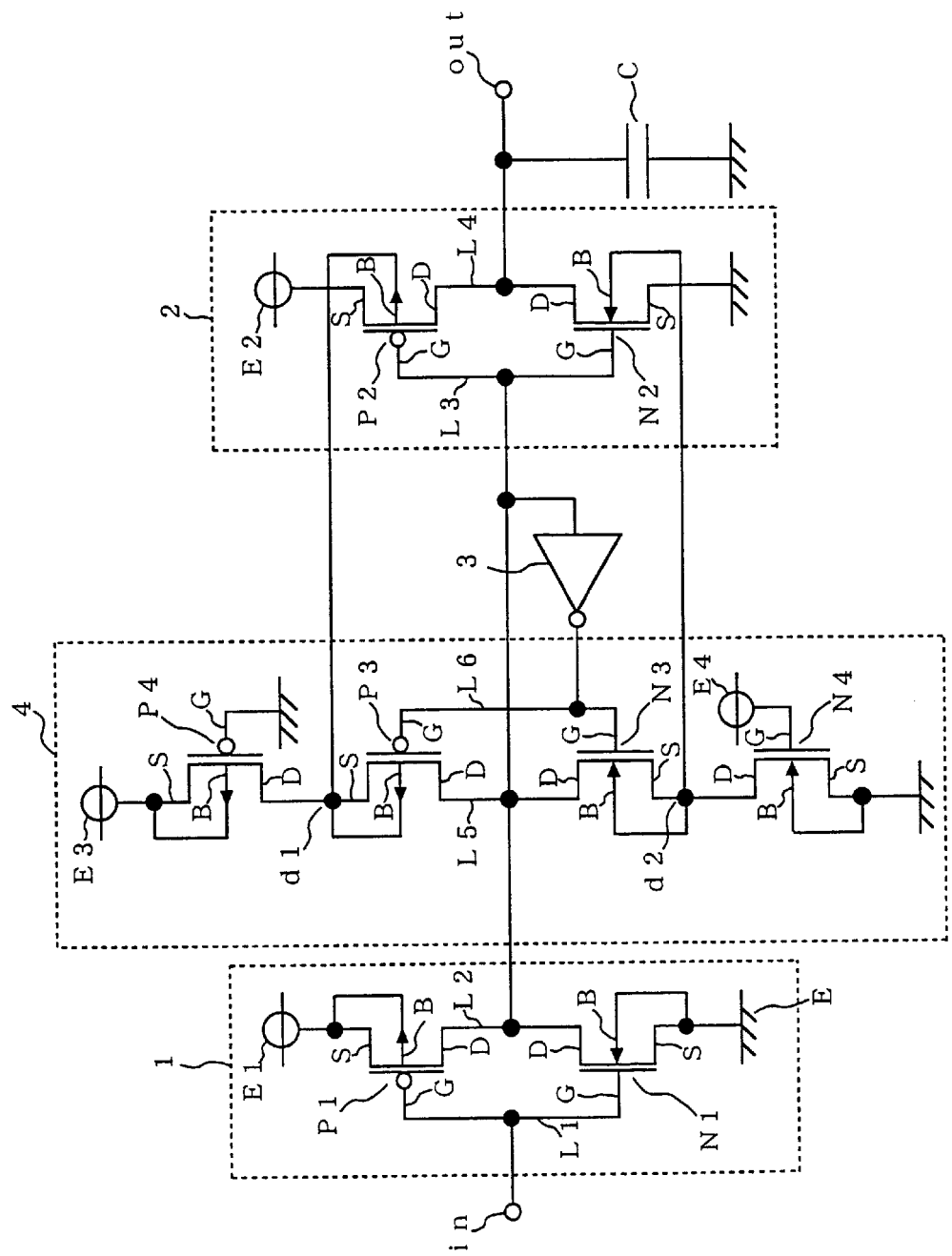
FIG. 4 is a circuit diagram showing an inverter as an embodiment 4 of the body voltage controlled semiconductor integrated circuit in accordance with the present invention.
Figure 5:
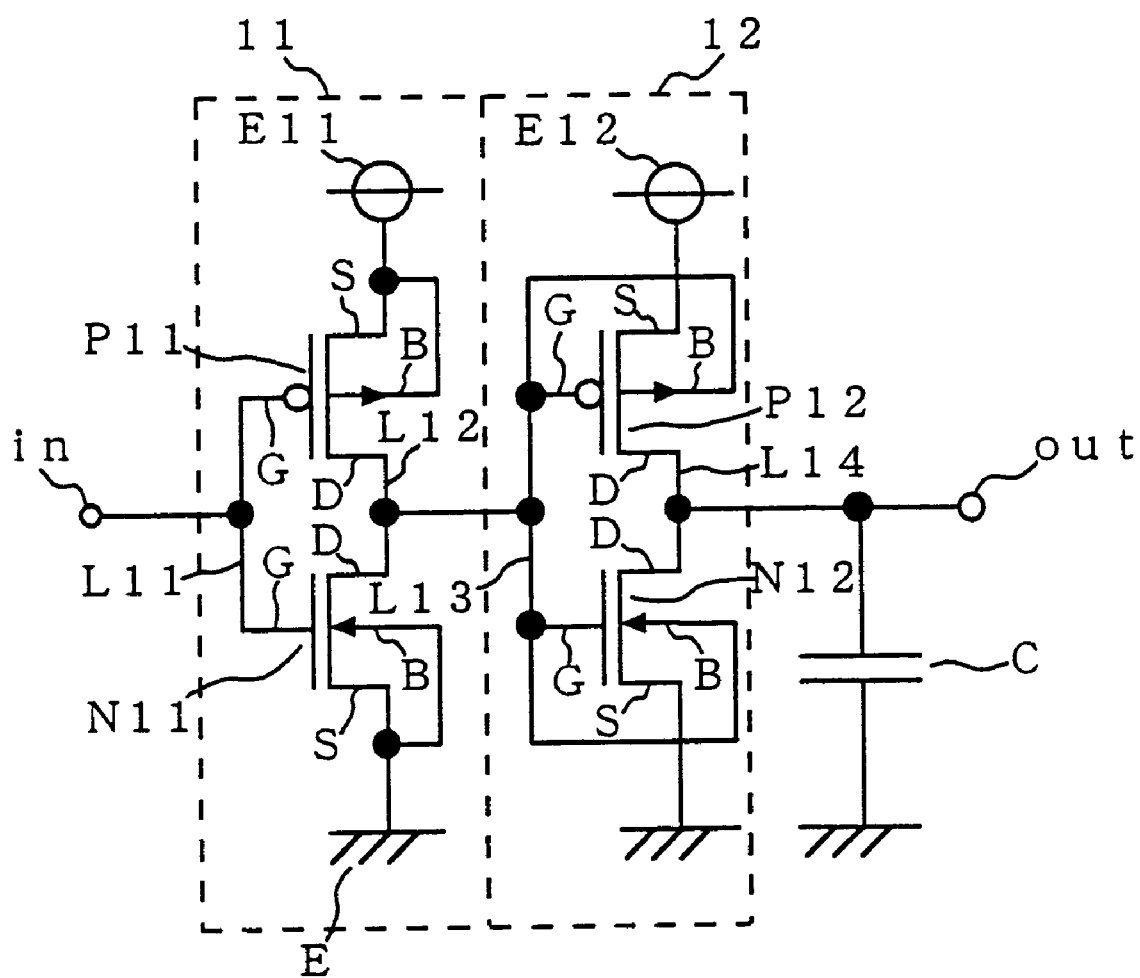
FIG. 5 is a circuit diagram showing an inverter as a conventional body voltage controlled semiconductor integrated circuit.
Figure 6:
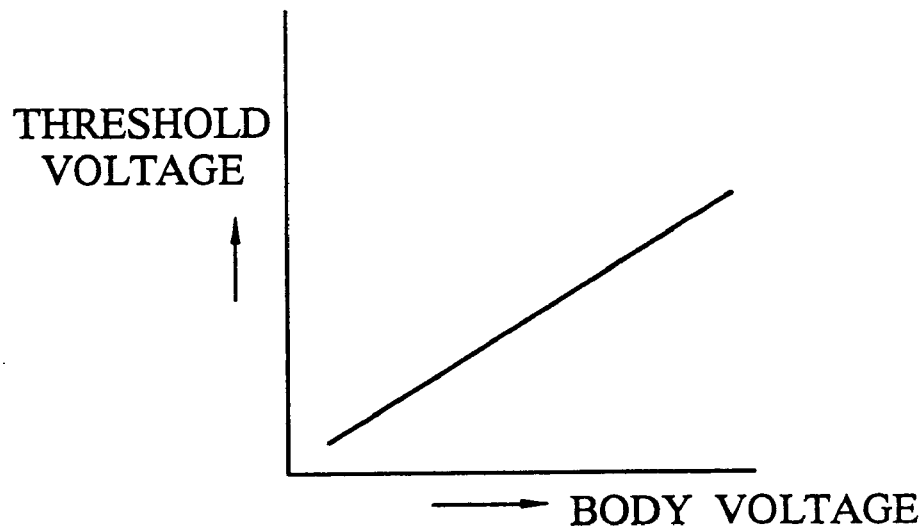
FIG. 6 is a graph illustrating characteristics of the threshold voltage versus the body voltage of a PMOS transistor.
Figure 7:
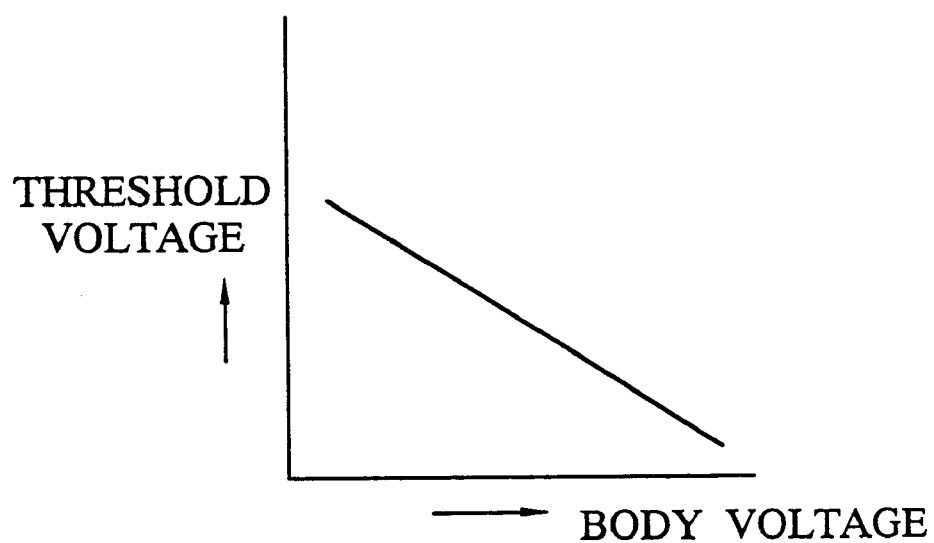
FIG. 7 is a graph illustrating characteristics of the threshold voltage versus the body voltage of an NMOS transistor.

FIG. 4 is a circuit diagram showing an embodiment 4 of the body voltage controlled semiconductor integrated circuit in accordance with the present invention. In this embodiment, the voltage divider circuit 4 is arranged in the same fashion as that of the embodiment 3. Since the remaining structure is the same as that of the embodiment 2 as shown in FIG. 2, the same portions are designated by the same reference symbols to omit duplicate explanation.

With such an arrangement, the embodiment 4 can not only quicken the inversion operation of the second inverter 2 for the same reason as in the embodiment 3, but also offer an advantage of isolating the load capacitance from the feedback loop of the output of the second inverter 2.

What is claimed is:

1. A body voltage controlled semiconductor integrated circuit comprising:

a first inverter including a first PMOS transistor, a first NMOS transistor, a first link interconnecting a gate electrode of said first PMOS transistor and a gate electrode of said first NMOS transistor, a second link interconnecting a drain electrode of said first PMOS transistor and a drain electrode of said first NMOS transistor;

a second inverter including a second PMOS transistor, a second NMOS transistor, a third link interconnecting a gate electrode of said second PMOS transistor and a gate electrode of said second NMOS transistor, a fourth link interconnecting a drain electrode of said second PMOS transistor and a drain electrode of said second NMOS transistor;

a voltage divider circuit including a third PMOS transistor, a third NMOS transistor, a fifth link interconnecting a drain electrode of said third PMOS transistor and a drain electrode of said third NMOS transistor, a sixth link connected to the second inverter interconnecting a gate electrode of said third PMOS transistor and a gate electrode of said third NMOS transistor, a fourth PMOS transistor which is connected between a body electrode and a source electrode of said third PMOS transistor, and which is always kept ON, a fourth NMOS transistor which is connected between a body electrode and a source electrode of said third NMOS transistor, and which is always kept ON, wherein said fifth link is connected with said second link and said third link, the source electrode of said third PMOS transistor is connected to a body electrode of said second PMOS transistor, and the source electrode of said third NMOS transistor is connected to a body electrode of said second NMOS transistor.

2. The body voltage controlled semiconductor integrated circuit as claimed in claim 1, wherein said sixth link is connected to said fourth link.

3. The body voltage controlled semiconductor integrated circuit as claimed in claim 1, further comprising a third inverter with its input terminal connected to said second link and its output terminal connected to said sixth link.

4. A body voltage controlled semiconductor integrated circuit comprising:

a first inverter including a first PMOS transistor, a first NMOS transistor, a first link interconnecting a gate electrode of said first PMOS transistor and a gate electrode of said first NMOS transistor, a second link interconnecting a drain electrode of said first PMOS transistor and a drain electrode of said first NMOS transistor;

a second inverter including a second PMOS transistor, a second NMOS transistor, a third link interconnecting a gate electrode of said second PMOS transistor and a gate electrode of said second NMOS transistor, a fourth link interconnecting a drain electrode of said second PMOS transistor and a drain electrode of said second NMOS transistor;

a voltage divider circuit including a third PMOS transistor with its body electrode and source electrode interconnected, a third NMOS transistor with its body electrode and source electrode interconnected, a fifth link interconnecting a drain electrode of said third PMOS transistor and a drain electrode of said third NMOS transistor, a sixth link connected to the second inverter interconnecting a gate electrode of said third PMOS transistor and a gate electrode of said third NMOS transistor, a fourth PMOS transistor which is connected to the body electrode of said third PMOS transistor, and which is always kept ON, a fourth NMOS transistor which is connected to the body electrode of said third NMOS transistor, and which is always kept ON, wherein said fifth link is connected with said second link and said third link, the source electrode of said third PMOS transistor is connected to a body electrode of said second PMOS transistor, and the source electrode of said third NMOS transistor is connected to a body electrode of said second NMOS transistor.

5. The body voltage controlled semiconductor integrated circuit as claimed in claim 4, wherein said sixth link is connected to said fourth link.

6. The body voltage controlled semiconductor integrated circuit as claimed in claim 4, further comprising a third inverter with its input terminal connected to said second link and its output terminal connected to said sixth link.

7. A circuit comprising:

an inverter circuit including a first field effect transistor having a first electrode and a second electrode and a gate electrode, and a second field effect transistor having a first electrode, a second electrode and a gate electrode, the first electrode of said second field effect field transistor connected to the first electrode of said first field effect transistor, and the gate electrode of said second field effect transistor connected to the gate electrode of said first field effect transistor; and a voltage dividing circuit including a third field effect transistor having a first electrode connected to the gate electrode of said first field effect transistor, a second electrode connected to a body region of said first field effect transistor, and a gate electrode connected to the first electrode of said first field effect transistor, and a fourth field effect transistor having a first electrode connected to the gate electrode of said second field effect transistor, a second electrode connected to a body region of said second field effect transistor and a gate electrode connected to the first electrode of said [third] second field effect transistor.

8. The circuit as claimed in claim 7, wherein a common input signal line is connected to the gate electrodes of said first and second field effect transistors, and an output signal line is connected to a node where the first electrodes of said first and second field effect transistors are connected.

9. The circuit as claimed in claim 7, wherein each of said first and third field effect transistors is of a n-type, and each of said second and fourth field effect transistors is of a P-type.

10. The circuit as claimed in claim 7, further comprising a fifth field effect transistor having a first electrode connected to the second electrode of said third field effect transistor, a second electrode and a gate electrode, wherein a fixed voltage is applied to the gate electrode of said fifth field effect transistor to render said fifth field effect transistor conductive.

11. The circuit as claimed in claim 7, wherein a body region of said third field effect transistor is connected to the second electrode of said fifth field effect transistor.

12. A circuit comprising:

a first inverter including a first field effect transistor having a first electrode, a second electrode and a gate electrode, and a second field effect transistor having a first electrode, a second electrode and a gate electrode, the first electrode of said second field effect transistor connected to the first electrode of said first field effect transistor, and the gate electrode of said second field effect transistor connected to the gate electrode of said first field effect transistor, a voltage dividing circuit including third and fourth field effect transistors, said third field effect transistor having a first electrode connected to the gate electrode of said first field effect transistor, a second electrode connected to a body region of said first field effect transistor and a gate electrode, said fourth field effect transistor having a first electrode connected to the gate electrode of said second field effect transistor, a second electrode connected to a body region of said second field effect transistor and a gate electrode connected to the gate electrode of said third field effect transistor; and a second inverter having an input connected to the gate electrode of said first field effect transistor and an output connected to the gate electrodes of said third and fourth field effect transistors.

13. The circuit as claimed in claim 12, wherein each of said first and third field effect transistors is of a P-type.

14. The circuit as claimed in claim 12, wherein each of said first and third field effect transistors is of an n-type.

15. The circuit as claimed in claim 12, wherein each of said first and third field effect transistors is of an n-type, and each of said second and fourth field effect transistors is of a P-type.

16. The circuit as claimed in claim 12, further comprising:

a third field effect transistor having a first electrode connected to the second electrode of said second field effect transistor, a second electrode and a gate electrode, wherein a fixed voltage is applied to the gate electrode of said third field effect transistor to render said third field effect transistor conductive.

17. The circuit as claimed in claim 16, wherein a body region of said third field effect transistor is connected to the second electrode of said fifth field effect transistor.

18. The circuit as claimed in claim 10, further comprising a sixth field effect transistor having a first electrode connected to the second electrode of said fourth field effect transistor, a second electrode and a gate electrode, wherein another fixed voltage is applied to the gate electrode of said sixth field effect transistor to render said sixth field effect transistor conductive.

19. A circuit for outputting an output signal in response to an input signal, comprising:

an inverter including a) a first transistor which is a p-type field effect transistor, having a gate electrode connected to a first node, a drain electrode connected to a second node, and a source electrode to which a first voltage is applied, and b) a second transistor which is an n-type field effect transistor, having a gate electrode connected to the first node, a drain electrode connected to the second node, and a source electrode to which a second voltage is applied, the second voltage being lower than the first voltage; and a control circuit for controlling a voltage applied to a body electrode of said first transistor and a body electrode of said second transistor in accordance with a voltage of the second node and the input signal, said control circuit including a) a third transistor receiving the input signal at a first terminal, connected to the second node at a gate terminal and connected to the body electrode of said first transistor at a second terminal, and b) a fourth transistor receiving the input signal at a first terminal connected to the second node at a gate terminal and connected to the body electrode of said second transistor at a second terminal, wherein a voltage of the first node varies in response to the input signal and the output signal is output from the second node.

20. The circuit as claimed in claim 19, wherein said third and fourth transistors are so configured as to be rendered complementarily conductive.

21. A circuit for outputting an output signal in response to an input signal, comprising:

a first inverter including a first transistor which is a p-type field effect transistor, having a gate electrode connected to a first node, a drain electrode connected to a second node, and a source electrode to which a first voltage is applied, and a second transistor which is an n-type field effect transistor, having a gate electrode connected to the first node, a drain electrode connected to the second node, and a source electrode to which a second voltage is applied, the second voltage being lower than the first voltage;

a second inverter for inverting a logic level of the input signal to output an inverted signal; and a control circuit for controlling voltages applied to a body electrode of said first transistor and a body electrode of said second transistor in accordance with a voltage of the input signal and the inverted signal output from said second inverter said control circuit including a third transistor receiving the inverted signal and connected to the first node and the body electrode of said first transistor and a fourth transistor receiving the inverted signal and connected to the first node and the body electrode of said second transistor, wherein a voltage of the first node varies in response to the input signal and the output signal is output from the second node.

22. The circuit as claimed in claim 21, wherein said third and fourth transistors are so configured as to be rendered conductive complementarily.

23. A circuit comprising:

a first inverter receiving an input signal and outputting an output signal having a logical value opposite to the input signal, including:

a first transistor which is a p-type field effect transistor, having a gate electrode connected to a first node receiving the first signal, a drain electrode connected to a second node providing the output signal and a source electrode to which a first voltage is applied, and a second transistor which is an n-type field effect transistor, having a gate electrode connected to the first node, a drain electrode connected to the second node and a source electrode to which a second voltage is applied, the second voltage being lower than the first voltage;

a control circuit connected to a third node, for controlling voltages applied to body electrodes of said first and second transistors in accordance with a voltage of the third node, said control circuit including:

a third transistor connected to the third node and the body electrode of said first transistor, and a fourth transistor connected to the third node and the body electrode of said second transistor; and a second inverter connected between the first and third nodes, bring the first and third node logical values opposite to each other.

24. The circuit as claimed in claim 23, wherein said third and fourth transistors are configured to be complementarily conductive.

* * * * *